United States Patent
Patti et al.

(10) Patent No.: US 6,469,945 B2
(45) Date of Patent: *Oct. 22, 2002

(54) DYNAMICALLY CONFIGURATED STORAGE ARRAY WITH IMPROVED DATA ACCESS

(75) Inventors: Robert Patti, Warrenville; Mark Francis Hilbert, Naperville, both of IL (US)

(73) Assignee: Tachyon Semiconductor Corp., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/861,076

(22) Filed: May 18, 2001

(65) Prior Publication Data

US 2001/0048625 A1 Dec. 6, 2001

Related U.S. Application Data

(63) Continuation-in-part of application No. 09/580,936, filed on May 25, 2000, now Pat. No. 6,236,602.

(51) Int. Cl.$^7$ .................................................. G11C 7/00
(52) U.S. Cl. ........................... 365/201; 365/200; 365/49
(58) Field of Search ................................. 365/201, 200, 365/49, 185.09, 230.06, 230.08, 189.01

(56) References Cited

U.S. PATENT DOCUMENTS 6,229,743 B1 * 5/2001 Matsumoto .................. 365/201
6,236,602 B1 * 5/2001 Patti ........................... 365/201

* cited by examiner

Primary Examiner—David Lam
(74) Attorney, Agent, or Firm—Calvin B. Ward

(57) ABSTRACT

A reconfigurable memory having M bit lines and a plurality of row lines, where M>1. The memory includes an array of memory storage cells, each memory storage cell storing a data value. The data value is read from or into the storage cells by coupling that data value to one of the bit lines in response to a row control signal on one of the row lines. A row select circuit generates the row control signal on one of the row lines in response to a row address being coupled to the row select circuit. The row select circuit includes a memory for storing a mapping of the row addresses to the row lines that determines which of the row lines is selected for each possible value of the row address.

4 Claims, 4 Drawing Sheets

DYNAMICALLY CONFIGURATED STORAGE ARRAY WITH IMPROVED DATA ACCESS

RELATED APPLICATIONS

This application is a continuation-in-part of U.S. patent application Ser. No. 09/580,936, filed May 25, 2000, now U.S. Pat. No. 6,236,602.

FIELD OF THE INVENTION

The present invention relates to memory systems, and more particularly, to a memory system that detects errors and reconfigures itself to avoid bad memory cells.

BACKGROUND OF THE INVENTION

As the cost of computational hardware has decreased, computers with ever-larger memory systems have proliferated. Systems with hundreds of Mbytes are common, and systems with a few Gbytes of memory are commercially available. As the size of the memory increases, problems arising from bad memory cells become more common.

Memory failures may be divided into two categories, those resulting from bad memory cells that are detected at the time of manufacture and those that arise from cells that fail during the operation of the memory. At present, problems arising from defective memory cells that are detected during the manufacturing process are cured by replacing the bad cells. The typical memory array is divided into blocks. Each memory chip has a predetermined number of spare blocks fabricated thereon. If a block in the memory is found to have a defective memory cell, the block in question is disconnected from the appropriate bus and one of the spares is connected to the bus in its place. However, once the part is packaged, there is no means for replacing a block with a spare, since the replacement process requires hard wiring of the spares to the bus.

The cost of testing the memory chips is a significant factor in the cost of the chips. The rate at which memory cells can be tested is limited by the internal organization of the memory blocks and the speed of the buses that connect the memory blocks to the test equipment. The various buses are limited to speeds of a few hundred MHz. Data is typically written and read in blocks having 64 bits or less. Since a write operation followed by a read operation requires several clock cycles, the rate at which memory can be tested is limited to 100 million tests per second. Extensive testing requires each memory cell to be tested a large number of times under different conditions such as temperature and clock speed. Hence, a 1 Gbyte memory chip would require minutes, if not hours, to thoroughly test. The cost of such testing would be prohibitive; hence, prior art memory chip designs will not permit extensive testing at the 1 Gbyte level and beyond.

Even when the obviously bad memory blocks have been removed, sooner or later, the memory will fail because of the failure of one or more cells in a block. The probability that such a failure will cause a system failure depends on the lifetime of the system, the size of the memory, and the type of memory. The probability of such a failure increases with the lifetime of the system and the size of the memory. While system lifetimes are not increasing, the size of memory is increasing. Accordingly, more system failures are expected.

In addition, some types of memory cells have higher failure rates than others. For example, EEPROM and flash memories can only be written a relatively small number of times compared to conventional DRAM and static RAM memories. In the case of EEPROMs and flash memories, the limited number of write cycles imposes severe restrictions on the possible applications of these memories. Similarly, memories based on ferroelectrics have relatively small lifetimes relative to these conventional memories; however, the ferroelectric memories can be written many more times than EEPROMs and flash memories.

In principle, all of these types of memories would benefit by having some form of reconfiguration system built directly into the memory. Such a system would replace blocks of memory that fail during the operational life of the system, thereby extending the lifetime of the system. However, prior to a memory cell actually failing, there is often a period of time in which the memory cell operates, but with a high error rate. Such a memory cell can cause intermittent system failures and may be very difficult to diagnose. Hence, any form of block replacement system that depends on detecting the failure of a block may not be able to operate successfully.

Broadly, it is the object of the present invention to provide an improved memory system.

It is a further object of the present invention to provide a memory system that can be reconfigured after the parts have been packaged.

It is a still further object of the present invention to provide a memory system that can detect memory cells with high error rates and replace these cells prior to the error rates causing system failures.

These and other objects of the present invention will become apparent to those skilled in the art from the following detailed description of the invention and the accompanying drawings.

SUMMARY OF THE INVENTION

The present invention is a reconfigurable memory having M bit lines and a plurality of row lines, where M>1. The memory includes an array of memory storage cells, each memory storage cell storing a data value. The data value is read from or into the storage cells by coupling that data value to one of the bit lines in response to a row control signal on one of the row lines. A row select circuit generates the row control signal on one of the row lines in response to a row address being coupled to the row select circuit. The row select circuit includes a memory for storing a mapping of the row addresses to the row lines that determines which of the row lines is selected for each possible value of the row address. The memory includes a plurality of sense amplifiers, one such sense amplifier being connected to each of the bit lines for measuring a signal value on that bit line. The memory includes a controller that tests the memory storage cells and eliminates references to rows having defective storage cells from the row mapping. When the memory is powered up, the controller tests the memory cells and assigns row addresses in a manner that eliminates references in the row mapping to rows having defective storage cells. In one embodiment of the invention, the memory also includes a single cell memory for storing a plurality of single data values, each data value corresponding to one of the row addresses and one of the bit lines. An insertion circuit causes that data value stored in the single cell memory for one of the row addresses and bit lines to replace that value stored in the memory storage cell coupled to that bit line when that row address is coupled to the row select circuit. The memory also includes a word assembly circuit for selecting N bit lines from said M bit lines, where N is less than or equal to M. The word assembly circuit includes a memory for storing a mapping specifying the N bit lines for each possible row address. In such embodiments, the controller alters the mapping to eliminate a reference in the mapping to a bit line that causes a defective storage cell to couple data to a bit line in response to one of the row addresses. The memory also includes an error correcting circuit for detecting errors in data words. The error correcting circuit generates a corrected data word and an error data word from the N data values coupled thereto, the error data word indicating which of the N data values, if any, was erroneous. The N data values are determined by a word assembly circuit that connects N of the M bit lines to the error correcting circuit, where N is less than or equal to M. A control circuit connected to the error correcting circuit uses the error data words and the row addresses to alter the mapping in the row select circuit in response to the error data words so as to avoid defective memory storage cells or bit lines.

DETAILED DESCRIPTION OF THE INVENTION

Figure 1:
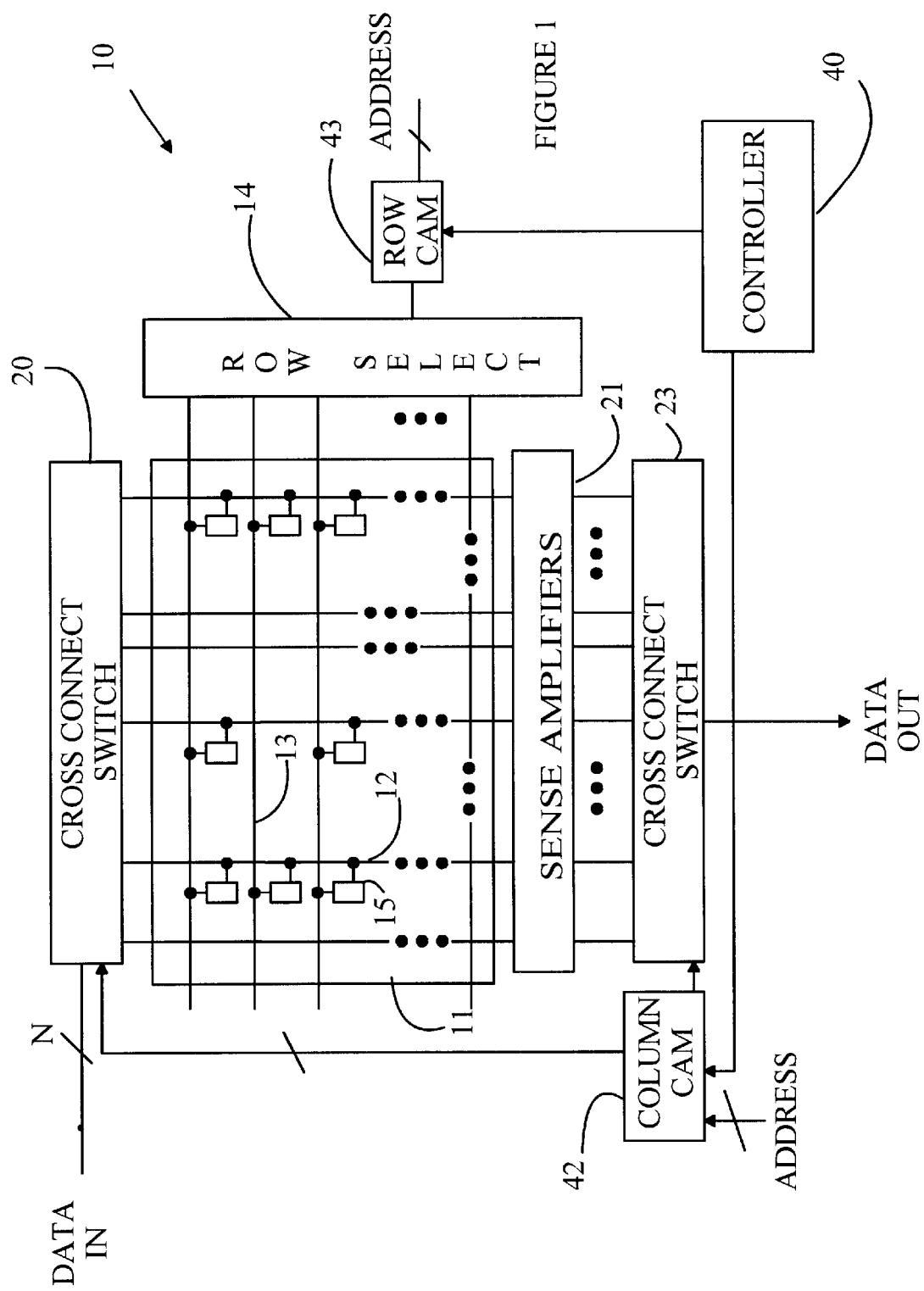
FIG. 1 is a block diagram of a memory 10 according to the present invention.

The manner in which the present invention gains its advantages can be more easily understood with reference to FIG. 1 which is a block diagram of a memory 10 according to the present invention. For the purposes of this discussion, it will be assumed that memory 10 stores data words having $N_D$ bits per word. The data is stored in a two-dimensional array 11 of memory cells that are organized into a plurality of rows and columns. A typical storage cell is shown at 15. All bits of any given data word are stored on the same row. The specific row is determined by a mapping that is stored in a content addressable memory (CAM) 43 that stores a mapping of the logical addresses used by the outside computer system to the row addresses used with memory 10.

In the preferred embodiment of the present invention, a number of words are stored in each row. A word is selected via a row select circuit 14 which causes the storage cells associated with that row to be connected to a plurality of bit lines. Hence, by placing the appropriate signal on line 13, storage cell 15 is connected to bit line 12. If data is to be written into the word, the data values are coupled to the appropriate bit lines via a cross-connect switch 20. If data is to be read from the word, the data values stored in the storage cells on the selected row are placed on the bit lines by the selected storage cells and decoded by a block of sense amplifiers 21. The specific bit lines corresponding to the desired word are then selected by cross-connect switch 23. The mapping of the physical bit lines to the logical address used by the outside computer system is stored in a row CAM 43.

There are additional rows and columns of storage cells in array 11 beyond those needed to store the number of bits for which the memory was designed. These spares can be used to replace the defective memory cells by changing the mapping stored in CAMs 42 and 43. In one embodiment of the present invention, each time memory 10 is powered up, a controller 40 loads the CAMs with default values and tests the memory array to determine if any bad rows or columns exist. If a bad row is found, controller 40 alters the mapping in CAM 43 such that the bad row is replaced by one of the spare rows. Similarly, if a bad column is found, the mapping in CAM 42 is altered such that the bad column is replaced by one of the spare columns.

As noted above, test speed has been a problem in prior art memory designs. The present invention overcomes the speed limitations by providing the testing function on the memory chip itself and by using a highly parallel testing strategy. During the testing phase, controller 40 stores and retrieves test values from entire rows. In general, the sense amplifier block 21 includes a register having one bit per bit line that latches the value read from the currently selected row. The values in this register may be connected back to the bit lines during the testing operation. Hence, many words can be tested in a single write/read operation. For example, in a 1 Gbyte embodiment of the present invention, each row includes 72 Kbits of storage.

Furthermore, the speed with which the controller can perform a test cycle on a row is not limited by the speed of the external bus that connects the memory to the central processing unit (CPU) in the computer system. Accordingly, the present invention can run at higher internal clock speeds during testing, and hence, provide even faster memory testing.

Finally, memory 10 is typically one of several memory blocks on a memory chip. For example, the 1 Gbyte embodiment of the present invention described above includes 4 such blocks. During testing, each block is isolated from the others and can perform tests in parallel with the other blocks. The combination of the high degree of parallel processing and increased internal speed allow the present invention to test memory cells at the rate sufficient to identify even intermittently failing cells prior to bringing the memory on line. The memory can then be configured to prevent data storage in the bad cells.

Figure 2:
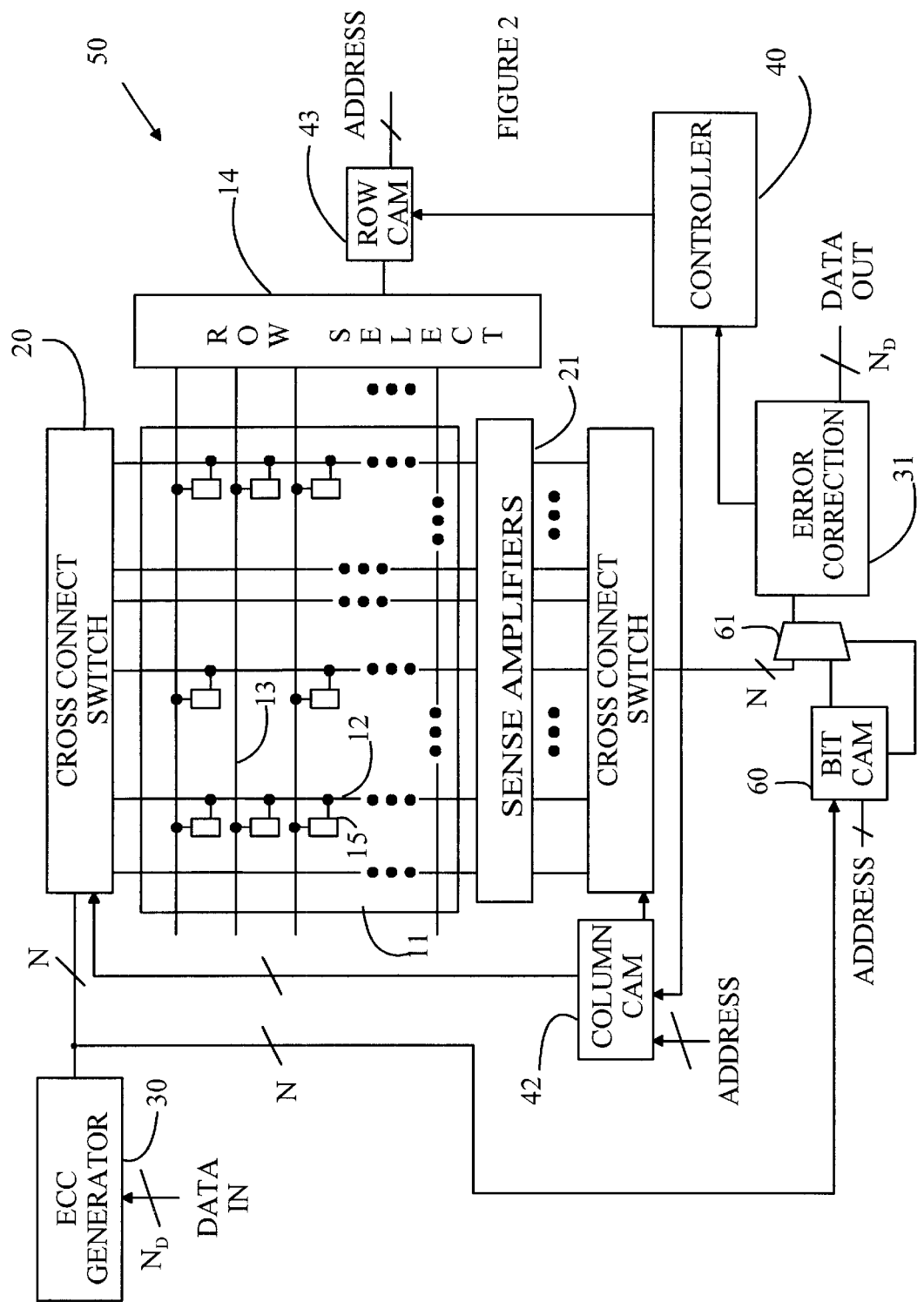
FIG. 2 is a block diagram of a memory 50 that utilizes error correcting codes according to the present invention.

In the preferred embodiment of the present invention, the actual data stored in the storage array is encoded via an error correction code to further improve the reliability of the memory. Refer now to FIG. 2, which is a block diagram of a memory 50 according to the present invention that utilizes an error correcting code. To simplify the following discussion, those elements of memory 50 that serve the same functions as elements shown in FIG. 1 have been given the same numerical designations and are assumed to perform the same functions unless the text indicates otherwise.

In memory 50, each word also includes a number of error correcting bits that are stored with the word. The error correcting bits are added to the data word by an error correcting code (ECC) generator 30 prior to storing the combined data and error correcting bits in storage array 11. Hence, each word actually occupies N storage cells, where $N > N_D$.

The error correcting bits serve two functions. First, the error correcting bits allow some bit errors to be corrected by error correction circuit 31. In the preferred embodiment of the present invention, sufficient error correcting bits are provided to allow all one-bit errors to be corrected and all two-bit errors to be detected. Error correcting codes that provide this type of functionality are well known to those in the art, and hence, will not be discussed in detail.

Second, the error correcting bits allow the present invention to determine which bits failed. This information is sent to controller 40 by error correcting circuit 31. Controller 40 keeps track of the locations of the errors to determine if one or more rows or columns of storage cells, or the electronics associated therewith are failing. When controller 40 determines that a particular column or row is failing, controller 40 substitutes a spare column or row included in storage array 11 for the failing column or row by altering the appropriate mapping in either CAM 42 or 43. In effect, memory 50 is in a test mode even when it is operating to store data.

Column replacements are much more costly, both in terms of down time for the memory and hardware, than row replacements. A row replacement can be accomplished in a single read-write cycle, since all of the bits of the old row are available at the same time and all of the bits of the new row can be written at once using the register in the sense amplifier block discussed above. In memories based on conventional DRAMs, the row replacement can be carried out as part of the normal refresh cycle.

The replacement of a column is somewhat more complicated, since each row in the defective column must be read and rewritten such that each cell in the defective row is replaced by a corresponding cell in one of the spare columns. During such a re-configuration involving a row replacement, the memory may not be available for a significant period of time. During the time a column is being replaced, the present invention stalls the central processor by making use of the serial master (SM) bus that is incorporated in many processor designs for out of band communications between memory and the CPU.

In addition, column replacements require the two cross-connect switches described above; while row replacements require only the register in the sense amplifier block. To reduce the complexity of these switches, the present invention utilizes a more restrictive form of column replacement. In the preferred embodiment of the present invention, each row can be replaced by only a limited number of the available spare rows. For example, a row might be defined to have 2 spare columns of memory cells between each two bytes on the row. These spares would service the bytes immediately adjacent to the spares; hence, the cross-connect switch would need only 32 switches for connecting these two bytes to the two spares. In contrast, 288 switching elements would be needed if all possible columns are to be used in any bit position. Hence, this restriction reduces the number of switching elements in the cross-connect switches, since a switching element is only needed between the lines that could potentially be connected to one another.

If the number of data bits per word is large compared to the number of bits in the address, it is more efficient to use a single bit CAM 60 for the spares than to replace an entire row when one bit in the row is defective. In embodiments of the present invention that utilize such single bit replacements, the data and bit location are stored in CAM 60 which inserts the data bit into the outbound data word with the aid of a multiplexer 61. Data for the defective bit is copied into CAM 60 at the same time the data for the remaining bits is stored in storage array 11. The specific bits that are stored in CAM 60 are determined by controller 40. To simplify the drawing, the connections between controller 40 and CAM 60 have been omitted.

In general, there will be a plurality of storage arrays such as storage array 11 that share the same cross-connect switches, sense amplifiers, etc. For each such array, column CAM will provide one mapping of the columns to the bits of the data words. The identity of the block currently connected to the sense amplifiers, etc. is determined by the row address. The blocks may be viewed as a partitioning of the rows into a sequence of blocks that share the same sense amplifier block; hence, the loss of a sense amplifier may still require a column replacement. Each block, however, has its own bit lines that operate independently of the bit lines of the other blocks; hence, a break in a bit line can be accommodated by mapping the rows to other blocks rather than replacing an entire column.

As noted above, column replacements are quite costly compared to row replacements; hence, it should also be noted that systems that do not use column replacements may be constructed without deviating from the teachings of the present invention. In such systems, the column CAM and much of the cross-connect hardware can be eliminated. The column CAM allows one to replace one column of storage cells with another column of storage cells. It provides the greatest benefit when one sense amplifier fails. If there are sufficient error correcting bits to correct for several bits in each word being in error, then the error correcting circuitry can cover the loss of the column without losing the entire memory array. Alternately, spare sense amplifiers may be included in each block of sense amplifiers together with the gates needed to insert a spare in place of a failed amplifier.

In the above-described embodiments of the present invention, the error correction circuit 31 communicates the identity of the bits that are found to be erroneous to the controller as the various data words are delivered to the CPU. The time to communicate this information and have the controller store it can be longer than a memory cycle. Accordingly, some error events will be lost in the sense that the controller will not record and act on the events even though the error correction circuit corrected the errors. This situation is most likely when the CPU is executing a section of code that concentrates heavily on memory accesses in one region of the memory and that region has a weak storage cell. In principle, this situation can lead to the loss of information about a second weak storage cell in another region of memory that is not being accessed as often, because the controller misses the error report for the second weak storage cell because of an overload of error reports for the first weak storage cell.

One method for avoiding such lost reports is to utilize a buffer in error correction circuit 31 that accumulates errors by the address at which the error occurred. Such a buffer can be constructed in a manner analogous to a CAM. A CAM stores a data record associated with a given address. Each time a request is made for data at a given address, the CAM recovers the record for that address and passes along the data record. In the preferred embodiment of the present invention, a device, referred to as a content addressable counter (CAC) is utilized to store the error records prior to transferring the same to the controller. A CAC stores one record for each address; however, the contents of the record are sets of counters corresponding to the various single bit errors that can be observed at any address. For example, if an error is seen in the second bit of a row at a given address, the CAC is queried to see if it has an entry for that address. If so, the second counter in the record is incremented. If no such record exists, the CAC assigns the next free record to that address and initializes the counters to zero. If no free records exist, the CAC has an overflow condition, and the contents of the CAC are sent to the controller for processing. All of the records are then marked for replacement and the memory proceeds accordingly. If any given counter reaches its maximum value, it is not incremented further.

The CAC can be part of the error correction circuit or the controller or a separate buffer located between the two. In the preferred embodiment of the present invention, the CAC is included in the controller if such a buffer is utilized.

While the present invention has been described in terms of a memory that reconfigures itself during operation to provide a memory of a predetermined size that is error free, the present invention may also be utilized to provide a memory that has a size that is communicated to the central processor at start up. In such embodiments, the present invention uses all of the spare rows to provide data storage during normal operation. At start up, controller 40 tests the memory to identify any bad rows. The remaining rows are mapped to memory addresses. The maximum number of words that are available are then communicated by controller 40 to the CPU over the SM bus.

Such embodiments of the present invention have the advantage of failing "gracefully" as more and more memory cells become inoperative with age. In general, data processing systems have some minimum RAM requirement. Most computer systems are sold with significantly more RAM than the minimum. RAM above this minimum improves the efficiency and stability of the system. For example, part of this additional RAM is used as a disk cache to reduce the delays associated with moving data from disk to memory. In conventional memory systems, a block of bad memory in the middle of the RAM will cause the memory to fail if an address in the bad block is used. Hence, even if the system is smart enough to spot the bad RAM and reduce the available RAM size such that addresses above the bad address are used, the system will have lost half its memory. In effect, the system has to throw out the good RAM that is above the bad block of memory since the operating system assumes that memory is contiguous. In contrast, the present invention "moves" the bad addresses to the back of the memory leaving all of the good memory in what appears to be a continuous block. Hence, even if a memory according to the present invention runs out of spare rows, it will always be able to use the good rows.

As noted above, the internal organization of a memory according to the preferred embodiment of the present invention provides for much faster testing than is available in conventional memories. Conventional memories are tested by storing and reading data across the memory bus between the central processor and the memory. Hence, the data rates are limited by the width and speed of the system bus which is typically less than or equal to 64 bits wide and which runs at approximately 100 MHz. Accordingly, periodic exhaustive or even thorough testing of a memory for cells to detect intermittent failures is not possible in prior art memory designs when memory size begins to exceed 100 Mbytes.

As a result of these limitations, memories are tested thoroughly once after fabrication and repairs made to defective parts, if possible. This process requires specialized test equipment and long testing times. Both of these factors increase the cost of the final memory. In addition, even with specialized test equipment, the time available for testing does not permit tests to be run over a full range of possible operating conditions. For example, a part that does not operate at the highest possible clock frequency may operate satisfactorily at a lower clock frequency, and hence, be useable. The cost of identifying such parts, however, precludes their reclamation and sale. In any event, once memory passes, it is not thoroughly tested again until a system in which it is located fails and diagnostic procedures are instituted to determine the cause of failure.

As noted above, the present invention overcomes these difficulties by providing a fast highly parallel system of memory testing on the memory chip. This aspect of the present invention will now be explained in more detail with the aid of FIG. 3, which is a block diagram of a memory 100 according to the present invention. Memory 100 differs from memory 10 discussed above in two significant aspects. First, memory 100 is constructed from a plurality of memory banks. Exemplary memory banks are shown at 101 and 102. Each memory bank is similar to that shown in FIG. 2. For example, memory bank 101 includes a controller 105, row and columns CAMs 109, ECC generator 108, storage array 111, and ECC correction circuit 107. The memory banks connect to a bus 104, which includes the various signal lines used to connect the memory to the external memory bus. A memory block interface 103 is used to connect, or disconnect, memory block 101 from the system bus 104. Hence, controller 105 can run tests on storage array 111 at the same time controller 205 in memory block 102 is running tests on the storage array in that memory block. Accordingly, the test time is reduced by a factor equal to the number of memory blocks in the memory.

In addition to the improvements provided by dividing the memory into blocks for testing, the present invention also takes advantage of the higher speeds with which the internal buses in the memory operate. In general, the internal buses will support clock rates that are higher than the system bus clock rate because of the short distances between components within the memory. In the preferred embodiment of the present invention, interface 103 includes a phase locked frequency generator that generates the clock signals used during testing from a slower clock signal on bus 104. In the preferred embodiment of the present invention, a number of different clock rates are tested to determine the highest frequency at which each memory block will function.

Finally, as noted above, the storage arrays utilize much wider rows than those used in conventional storage arrays. In one embodiment of the present invention of the type shown in FIG. 2, each row includes 72 Kbits and there are 4 memory blocks providing a total of 1 Gbyte of storage. Hence, this embodiment reads and writes storage words that are effectively 288 Kbits long. During testing all 4 blocks read and write in parallel. During normal operation, 64 bit words are read and written from the appropriate block in the memory as determined by the address associated with the word. The row assigned to that address is read in parallel providing 1024 64 bit words together with 8 ECC bits for each 64-bit word. This data is stored in a register that is part of the sense amplifier array. The appropriate 72 columns are directed to the ECC circuitry by a cross-connect switch as described above with reference to memory 10 discussed above. It should be noted that after reading out the requested word, the remaining words are still available in the output register. Hence, if a second read request, directed to another word in this row is received prior to the contents of this register being altered, that request can be serviced in a fraction of the access time required to provide the first word from the row.

A write operation is somewhat more complicated. To write data to one of the positions in the row, the entire row is first read out into the output register discussed above. The new data, together with its additional ECC bits, is then written into the appropriate location in that register, and the entire row is written back into the storage array. The same cross-connect switch used to reconfigure the memory can be used to direct the 64 bits being written to the appropriate location in the register.

Since the present invention can perform an extensive memory test during the power up cycle of a computer, the expensive and time consuming memory testing normally performed on the production line can be omitted. In the preferred embodiment of the present invention, the memory is tested during burn-in at a number of different clock speeds. The results of the testing can be utilized to sort the memory by performance characteristics. For example, memory chips that operate over a wider range of temperature and/or frequency can be sorted and sold for a premium.

The embodiments discussed above utilize a CAM to map the physical addresses within the memory chip, i.e., row and columns in the storage array, to the logical addresses utilized by the computer system in which the memory functions. However, it will be obvious to those skilled in the art from the preceding discussion that any form of mapping circuit can be utilized for this function. In addition, the mapping circuit can include some form of non-volatile memory such as EEPROM or FLASH in which the address mapping is stored when power is turned off. Such storage allows the memory to be configured once during burn in. This type of memory would mimic conventional memory, and hence, provide upward compatibility in systems that do not test memory prior to operation.

The above-described embodiments of the present invention store the error correcting bits on the same row as the data bits. However, it will be obvious to those skilled in the art from the preceding discussion that these bits can be stored in a separate storage array which is accessed via row select circuitry or directly via the word address. In the latter case, the error correcting code storage space is not reconfigurable; however, savings in CAM hardware are achieved.

The above-described embodiments of the present invention store one bit per memory storage cell. That is, the data values read from the bit lines are either 1 or 0. However, the present invention may also be utilized in "multi-level" memories in which each storage cell stores a plurality of bits in the form of an analog value that is decoded by the sense amplifiers which now include some form of analog-to-digital converter. In this case, the single data values run from 0 to V, where V>1.

The above-described embodiments of the present invention utilize the error-correcting code hardware both to correct damaged data and to detect memory cells that have failed or have a high error rate, and hence, should not be used. In very high-speed memories, the error-correcting code hardware can slow down the memory, since even uncorrupted data must wait for the ECC hardware to determine if a data word is in error. Embodiments of the present invention that avoid these delays while allowing reconfiguration can also be constructed without deviating from the teachings of the present invention.

Figure 4:
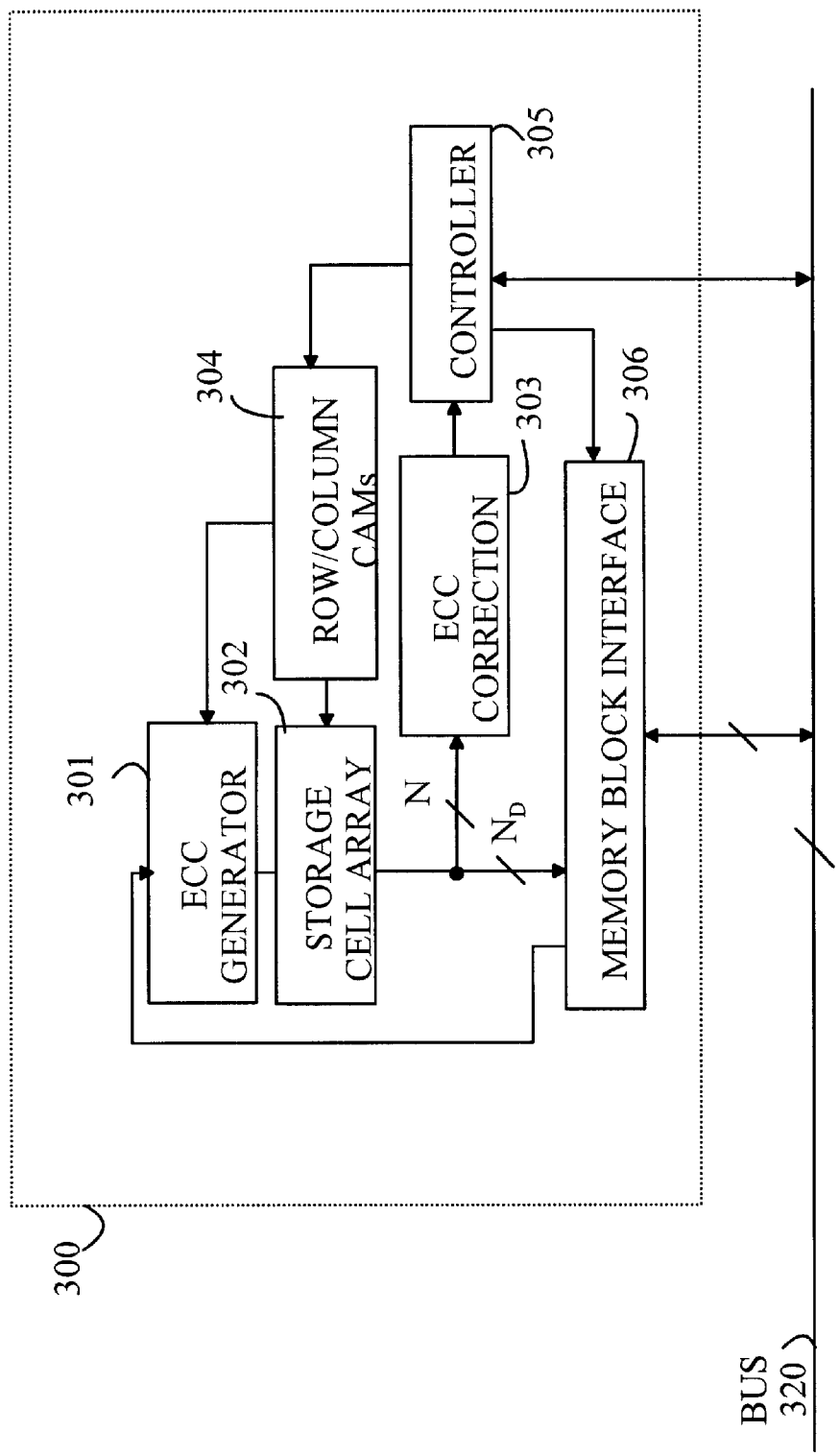
FIG. 4 is a block diagram of a memory according to another embodiment of the present invention.

Refer now to FIG. 4, which is a block diagram of a memory 300 according to the present invention connected to a bus 320 that is used to transfer the data to a central processor or the like. Memory 300 includes a bus interface 306 that sends and receives data on bus 320. An error-correcting code generating circuit 301 inserts the ECC bits into data words stored in storage array 302. The physical location of the storage locations corresponding to any given address are stored in the row/column CAMs shown at 304. Memory 300 operates substantially the same as the memories according to the present invention discussed above with respect to storing in storage array 302 and fetching data therefrom. The rows and columns selected by CAM 304 are determined by the address presented on bus 320 and the data stored in the CAMs by controller 305. The connections between bus interface 306 and CAM 304 have been omitted to simplify the drawing.

Memory 300 differs from the embodiments of the present invention described above in that data retrieved from storage array 302 is immediately provided both to bus interface 306 and ECC correction circuit 303. This requires that the error correcting scheme utilize a code in which the data bits are augmented by a number of "error correcting bits" such that the data bits are immediately accessible.

Figure 3:
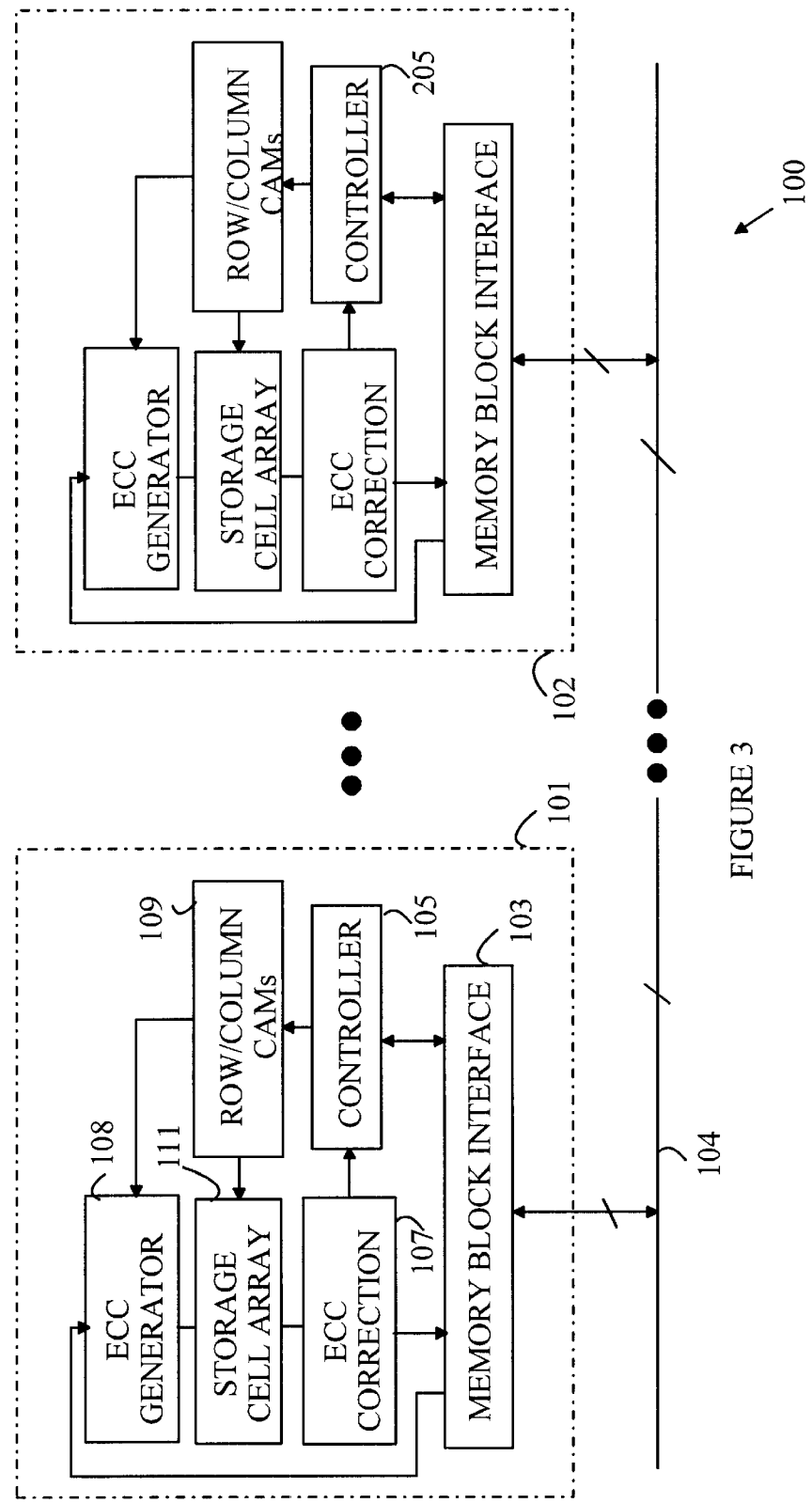
FIG. 3 is a block diagram of a memory 100 constructed from a plurality of memory banks according to the present invention.

If a data error is detected by ECC correction circuit 303, the data indicating the corrected data word and the bits that were in error are forwarded to controller 305 in a manner analogous to that discussed above with respect to the embodiments of the present invention that are shown in FIGS. 2 and 3. This data is used to identify storage locations that are defective so that controller 305 can map the corresponding addresses to non-defective rows and columns of storage array 302. The background data collection and remapping of the CAMs is carried out in an analogous manner as that described above.

If ECC correcting circuit 303 detects a data error there are three possible actions depending on the particular embodiment of the present invention being utilized. First, controller 305 could just allow the bad data to be delivered to the device on the other end of bus 320. Such an embodiment would be no worse than the prior art memory systems currently being used in data processing systems.

Second, the error correcting bits can also be placed on the bus. In this embodiment, the receiving device is assumed to also have an ECC correcting circuit that can at least detect the presence of an error in the delivered data word. The recipient can then correct the data or re-request the data if the recipient has only partial error correcting capability.

Third, controller 305 can signal an error and cause the intended recipient of the data to delay reading the bus. The error signal can cause the recipient to resubmit the read request or at least wait one bus cycle before reading the data. During the resulting delay, controller 305 loads bus interface 306 with the corrected data, and hence, the recipient receives the corrected data after a one memory cycle delay. Since erroneous data is assumed to occur relatively infrequently, such delays are of little consequence in the overall speed of the data processing system.

The error signal can be generated on bus 320 by controller 305 in systems that provide for a bus fault signal or detect bus faults. In another embodiment of the present invention, controller 320 initiates an interrupt whose processing software causes the data to be re-requested. Alternatively, the signal can cause the cache associated with the data processor to be flushed, which will also cause a re-read of the data on the next cache miss at the address in question. Finally, a separate bus line can be provided for signaling such errors.

Various modifications to the present invention will become apparent to those skilled in the art from the foregoing description and accompanying drawings. Accordingly, the present invention is to be limited solely by the scope of the following claims.

What is claimed is:

1. A reconfigurable memory comprising:
   M bit lines, where M>1;
   a plurality of row lines;
   an array of memory storage cells, each memory storage cell storing a data value and comprising circuitry for coupling that data value to one of said bit lines in response to a row control signal on one of said row lines;
   a row select circuit for generating said row control signal on one of said row lines in response to a row address being coupled to said row select circuit, said row select circuit comprising a memory for storing a mapping of said row addresses to said row lines, said mapping determining which of said row lines is selected for each possible value of said row address;

a controller for determining that one of said memory cells is defective and for altering said mapping if one of said memory cells is determined to be defective;

an error correcting circuit for detecting errors in data words, said error correcting circuit generating an error data word from N data values coupled thereto, wherein N is less than or equal to M, said error data word indicating which of said N data values, if any, was erroneous;

a bus interface circuit for coupling values stored in said array of memory storage cells to a bus; and a word assembly circuit for connecting N of said M bit lines to said error correcting circuit and $N_D$ of said M bit lines to said bus interface circuit, wherein $N_D$ is less than or equal to N, and said control circuit alters said mapping in said row select circuit in response to said error data words indicating that one of said memory storage cells is defective.

2. The memory of claim 1 wherein said controller further comprises a read abort circuit for generating an abort signal indicating that one of said values coupled by said bus interface is in error.

3. The memory of claim 2 wherein said abort signal causes a device connected to said bus to delay reading data on said bus for a time sufficient to allow said controller to couple corrected values to said bus interface circuit.

4. The memory of claim 3 wherein said abort signal causes a fault to be detected on said bus by a device connected to said bus.

* * * * *